United States Patent
Molnar et al.

(10) Patent No.: US 8,767,047 B2
(45) Date of Patent: Jul. 1, 2014

(54) ANGLE SENSITIVE PIXEL (ASP)-BASED IMAGE PROCESSING SYSTEM, METHOD, AND APPLICATIONS

(75) Inventors: Alyosha Molnar, Ithaca, NY (US); Albert Wang, Ithaca, NY (US); Patrick Gill, Sunnyvale, CA (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 13/813,761

(22) PCT Filed: Aug. 3, 2011

(86) PCT No.: PCT/US2011/046376
§ 371 (c)(1),
(2), (4) Date: May 21, 2013

(87) PCT Pub. No.: WO2012/018887
PCT Pub. Date: Feb. 9, 2012

(65) Prior Publication Data
US 2013/0229486 A1     Sep. 5, 2013

Related U.S. Application Data

(60) Provisional application No. 61/499,372, filed on Jun. 21, 2011, provisional application No. 61/370,193, filed on Aug. 3, 2010.

(51) Int. Cl.
*H04N 13/04* (2006.01)

(52) U.S. Cl.
USPC .............................. 348/44; 348/43

(58) Field of Classification Search
None
See application file for complete search history.

(56) References Cited

U.S. PATENT DOCUMENTS 6,097,394 A * 8/2000 Levoy et al. ................. 345/419
6,654,123 B2 * 11/2003 Shimizu ....................... 356/445

(Continued)

FOREIGN PATENT DOCUMENTS

CN        1601231 A *   3/2005
JP        2004279191    10/2004

(Continued)

OTHER PUBLICATIONS

Wang et al. "An Angle-Sensative CMOS Imager for Single-Sensor 3D photography" (Feb. 2011) IEEE Inter. Solid-State Circuits Conference. Ses: 23.7.*

(Continued)

*Primary Examiner* — Sath V Perungavoor
*Assistant Examiner* — Matthew J Anderson
(74) *Attorney, Agent, or Firm* — William Greener; Bond, Schoeneck & King, PLLC

(57) ABSTRACT

An image processing system includes at least two, complementary, angle sensitive pixel (ASP) structures, having a spatial frequency domain ASP output including a background output and a plurality of ASP response outputs, in response to an optical input; an ASP response output subtractor component, which functions to suppress the background output and perform a subtraction of at least two of the ASP response outputs; and a processing component that can process the subtracted spatial frequency domain ASP response outputs. An optical domain image processing method includes the steps of providing at least two, complementary, angle sensitive pixel (ASP) structures; obtaining a spatial frequency domain ASP output including a plurality of complementary ASP response outputs, in response to an optical input; performing a wavelet-like transform of the ASP response outputs in the optical domain prior to performing any operation in a digital domain; and obtaining a desired output of the optical input.

25 Claims, 18 Drawing Sheets

(56) References Cited

U.S. PATENT DOCUMENTS

| | | | |
|---|---|---|---|
| 7,548,359 B2* | 6/2009 | Murakami et al. | 359/15 |
| 7,965,936 B2* | 6/2011 | Raskar et al. | 396/268 |
| 8,063,379 B2* | 11/2011 | Suhami | 250/370.09 |
| 8,120,683 B1* | 2/2012 | Tumer et al. | 348/295 |
| 8,134,115 B2* | 3/2012 | Koskinen et al. | 250/226 |
| 8,179,457 B2* | 5/2012 | Koskinen et al. | 348/273 |
| 8,384,861 B2* | 2/2013 | Jepsen | 349/114 |
| 8,390,800 B2* | 3/2013 | Fattal et al. | 356/138 |
| 8,530,811 B2* | 9/2013 | Molnar et al. | 250/206.1 |
| 2010/0085642 A1* | 4/2010 | Drinkwater | 359/567 |
| 2010/0230581 A1* | 9/2010 | Leijtens et al. | 250/208.2 |
| 2011/0001165 A1* | 1/2011 | Smith et al. | 257/184 |

FOREIGN PATENT DOCUMENTS

| | | |
|---|---|---|
| JP | 2005061981 | 3/2005 |
| WO | 2010044943 | 4/2010 |

OTHER PUBLICATIONS

Wang et al. "Angle Sensitive Pixels in CMOS for Lensless 3D Imaging". (Sep. 2009) IEEE Custom Integrated Circuits Conference.*

"Molinar Group" The Internet Archive. Captured on Jul. 12, 2011.*

Wang, A. et al., Light field image sensors based on the Talbot effect, Applied Optics, vol. 48, No. 31, Nov. 1, 2009, pp. 5897-5905.

International Search Report Form PCT/ISA/220, International Application No. PCT/US2011/046376, pp. 1-8, dated Feb. 21, 2012.

* cited by examiner

ANGLE SENSITIVE PIXEL (ASP)-BASED IMAGE PROCESSING SYSTEM, METHOD, AND APPLICATIONS

RELATED APPLICATION DATA

The instant application claims priority to U.S. Provisional application Ser. No. 61/370,193 filed on Aug. 3, 2010 and U.S. Provisional application Ser. No. 61/499,372 filed on Jun. 21, 2011, the subject matter of which are incorporated herein by reference in their entireties.

BACKGROUND

1. Field of the Invention

Embodiments of the invention are generally directed to the field of image processing. More particularly, embodiments of the invention are directed to image processing systems, methods, and applications based upon angle-sensitive pixel (ASP) devices with and without lenses. The embodied systems, methods, and application utilize the measurable intensity and direction angle of a light field provided by the ASP devices. Embodiments of the invention further generally relate to the use of pixel-scale diffractive optics to perform image processing on-chip using zero power and further include, without limitation, CMOS-integrated ASP-based micro-camera imaging devices, imaging methods associated with said device embodiments, and applications thereof.

2. Related Art Discussion

Image Encoding in Vision Systems

Visual systems capture and process information in several steps, starting with a lens to focus light from the outside world onto a homogenous array of sensors. For far-field imaging, this means that the lens converts the incident angle of light to a 2-D spatial location. The sensors (rods and cones in the vertebrate eye, photodiodes in a typical electronic image sensor) then transduce this local light intensity into an electrical current or voltage.

In the vertebrate visual system, visual information is processed locally in the retina, enhancing spatial contrast and recoding visual information at each location into at least 12 parallel pathways. These pathways each respond selectively to certain features of the scenes, such as edges at different spatial scales, and directional motion. These diverse signals are encoded as discrete spikes in the optic nerve to the brain. In visual cortex this diversity is further increased by also encoding information related to edge orientation and spatial scale. Thus natural visual processing involves recoding the visual world into an increasingly diverse set of pathways tailored to specific visual structures of interest.

Modern image and video capture systems increasingly use a similar approach. While very large arrays of light sensors are now commonplace, it is rare for this information to be stored or transmitted in a pure, bitmap form. It is much more common to follow image capture and digitization with immediate (and usually lossy) compression. Furthermore, while most images and video are captured and coded so as to appear natural to human viewers, it often makes sense to capture and compress images and video for specific tasks (such as transmitting sign language). In such cases, it appears that task-relevant information can often be interpreted even if insufficient information has been transmitted to reconstruct an image that "looks like" the naturally perceived scene). Furthermore, image information may never be viewed by a human at all, but may instead be directly interpreted by a machine working to extract some specific piece of information, such as, e.g., optical flow for navigation, target tracking, text extraction, or face and fingerprint recognition. In all of these cases, from simple compression, to task-specific extraction, to machine vision, one of the key processing steps is to recode the visual scene in terms of a set of heterogeneous features. Not surprisingly, many of these features bear striking similarity to the responses of various pathways in the vertebrate visual system, and especially to the responses of V1 neurons.

Most modern image processing is based upon a few standard mathematical tools, such as the Fourier transform and Gabor filters. When applied to natural scenes these transforms send most of their outputs close to zero, with most of the information in the scene encoded in the remaining outputs: that is, the output is sparse. Furthermore, the resulting non-zero outputs are in a format more easily interpreted than raw pixels. Thus subsequent image processing becomes much more efficient once these transforms have been performed. To apply these techniques, however, the light from the scene must first be focused onto an image sensor, transduced, buffered, digitized, and transformed (filtered) in the digital domain. Digitization and filtering consume a significant amount of power, even if subsequent processing is efficient. As a result, visual information generally cannot be gathered from tightly power-constrained platforms such as wireless sensor nodes.

One of the most common filters used in image and video compression and interpretation is the Gabor filter (sometimes called the Gabor wavelet). Gabor filter banks essentially perform local, low-order 2-D Fourier transforms, windowed by a Gaussian envelope. The 2-D impulse response at spatial location (x,y) is given by:

$$G(x, y) = \exp\left(\frac{x^2 + y^2}{2\sigma^2}\right)\cos\left(\frac{ax + by}{\sigma} + \alpha\right) \quad (1)$$

Diverse Gabor filters can be generated (see FIG. 1), by varying periodicity ($\sqrt{a^2+b^2}$), orientation ($\tan^{-1}(b/a)$), phase ($\alpha$), and overall spatial scale ($\sigma$). For most values of a and b, the filters have roughly zero mean. Thus, when convolved with natural images these filters will generate zero output for areas of uniform brightness (the sky and the man's suit in FIG. 1a); that is, these filters produce outputs that are sparse. For example, the filter used in FIG. 1a only generates significant outputs in regions with horizontal features on the spatial scale of about 10 pixels. In this case, the eyes, chin, and fingers of the man meet this criterion, whereas most other regions do not, and generate zero output. In order to capture other features of the scene, other filters can be used, by varying various parameters (see FIGS. 1(b-e)).

In order to ensure that all of the information of the scene is preserved, a sufficient diversity of filters must be used to span the space of inputs. This requires that there be at least as many filter outputs as pixels in the original picture being analyzed. An example of this is block-based filtering, where an image is broken up into a set of blocks. Each of these blocks is then filtered by an array of heterogeneous filters with different orientations, phases and periodicities.

If these filters are chosen appropriately, the result is similar to computing a 2-D Fourier transform on that block. In this case there will be as many distinct filters operating on each block as there are pixels in the block, and the transform will be invertible; i.e., no information is lost. However, as shown in FIG. 1a, most of these outputs will be near zero. Rounding these outputs to zero and encoding them efficiently permits dramatic compression of the scene without significant loss of information. Block level transforms followed by rounding are the basis of most lossy compression algorithms (such as JPEG). If multiple spatial scales of filter are used (FIG. 1*e*), such as in wavelet transforms, even greater sparseness is possible.

While having an equal number of inputs and independent outputs guarantees invertibility, having more outputs than inputs (over-completeness) can actually yield a more efficient representation of images. For example, over-complete basis sets of Gabor filters have been shown to generate sparser outputs than orthogonal ones. A variety of methods have been developed for finding this optimally sparse set, the most popular of which are generally known as "basis pursuit" algorithms, which work to minimize both the mean-square error between input and output (that is, the L2 norm of error), as well as the summed absolute values of the output (the L1 norm of output).

Beyond simple compression of images, Gabor Filters and 2-D Fourier transforms provide the basis for a wide variety of higher-order visual analyses, from object recognition and segmentation, to motion detection, to texture characterization. While many of these functions work with block-based transforms, including of multiple scales of Gabor filter (FIG. 1*e*) allows "scale invariant" transforms, which in turn enable a variety of efficient object and texture recognition techniques.

Many of these analyses do not require a complete, invertible set of filters. For example, an over-complete filter set can include outputs that precisely match interesting features, reducing subsequent processing. Similarly, under-complete filter banks, if tuned for specific visual tasks, can suffice for those tasks. For example, the filter in FIG. 1*a* suffices for detecting and localizing horizontal edges (such as the horizon) even if it is not sufficient to reconstruct an entire scene.

Angle Sensitive Pixels (ASPs)

Recent work by the instant inventors has demonstrated a new class of pixel-scale light sensor that captures information about both the intensity and distribution of incident angle of the light it detects (see International Patent Application WO/2010/044943, the subject matter of which is incorporated herein by reference in its entirety to the fullest allowable extent). These angle sensitive pixels (ASPs) are implemented as shown in FIG. 2. A photodiode is overlaid by a pair of stacked metal diffraction gratings. Light incident upon the upper grating generates periodic diffraction patterns ("self-images") at certain depths beneath the grating (see FIG. 2*a*), an effect known as the Talbot effect. Self images are maximum strength at certain Talbot distance that are integer multiples of the square of the grating pitch (d), divided by wavelength of the light ($\lambda$)

$$z_T = d^2/\lambda \quad (2)$$

In an ASP, the diffracted light is projected onto a second "analyzer grating" of equal pitch, placed at one of the Talbot depths, $h = n \cdot z_T$. Self images shift laterally in response to shifts in the incident angle, and the analyzer grating either blocks or passes light depending upon the relative positions of the self-image peaks and analyzer grating (see FIG. 2*b*). When the peaks align with gaps in the grating, light passes; when they align with the wires, it is blocked. Light passed by this grating is measured by the photodiode beneath these gratings. Because both the self-image and analyzer gratings are periodic, the amount of light passed also varies periodically with incident angle, $\theta$ according to the equation:

$$I = I_o A(\theta)(1 - m \cos(\beta\theta + \alpha)), \quad (3)$$

where $\beta = 2\pi \cdot h/d$ defines the periodicity of the response when the analyzer grating has a depth h below the primary grating. $I_o$ is incident intensity, modulation depth m (0<m<1), is set by the magnitude of the self-image, and $\alpha$ is set by the lateral offset between the primary and analyzer gratings. $A(\theta)$ is a windowing function that accounts for effects of metal sidewalls and reflections at the surface of the chip.

Equation (3) only applies for $\theta$ measured perpendicular to the orientation of the grating wires. Sweeping the incident angle parallel to the grating ($\phi$) does not shift the self-image peaks relative to the analyzer grating, so that $\phi$ only affects ASP output by multiplying it by the aperture function $A(\phi)$.

ASPs have been manufactured entirely in a standard CMOS process using doped wells as photodiodes and metal interconnect layers for local gratings. Because the gratings are of a fine pitch (<1 µm), ASPs can be built on the scale of a single CMOS imager pixel. Their small size and natural integration also means that large arrays of ASPs are entirely feasible with current technology. The measured response of a single ASP is shown in FIG. 2*c*. Sweeping incident angle perpendicular to the grating orientation produces a strongly angle-dependant, periodic response, as predicted by eq. 2.

ASPs were developed originally to allow localization of micro-scale luminous sources in 3-dimensions without a lens. In order to do this, it was necessary to compute incident angle at each location, requiring multiple ASPs tuned to different phases ($\alpha$ in eq. 3), and also requiring both vertically and horizontally oriented ASPs. These capabilities were realized using two different grating orientations (see FIG. 3*a*) having four different grating offsets (for $\alpha = 0, \pi/2, \pi, 3\pi/2$ (the gratings are offset by multiples of ¼ the grating pitch: see FIGS. 3*b, c*).

The inventors recognize that solutions and improvements to the known shortcomings, challenges, and problems in the prior art are necessary and would be beneficial. More specifically, in contrast to other approaches that require multiple lenses and/or moving parts, devices that are monolithic, require no optical components aside from the sensor itself, and which can be manufactured in a standard planar microfabrication process (e.g., CMOS) would be advantageous in the art. Any imaging system where power consumption, size and cost are at a premium, will benefit from the techniques taught by this invention. The embodiments of the invention disclosed and claimed herein successfully address the aforementioned issues, solve the unresolved problems in the art, and achieve the recited goals.

SUMMARY

An embodiment of the invention is an image processing system. The image processing system includes at least two, complementary, angle sensitive pixel (ASP) structures, having a spatial frequency domain ASP output that includes a background output and a plurality of ASP response (signal) outputs, in response to an optical input, an ASP response output subtractor component that functions to suppress the background output and performs a subtraction of at least two of the ASP response outputs, and a processing component that can process the subtracted spatial frequency domain ASP response output. According to various non-limiting aspects of the embodied system:
  at least some of the at least two ASP structures are diverse ASP structures that have at least one of a different periodicity, orientation, phase, and spatial scale;
  the at least two ASP structures include a sufficient number of ASP structures to provide an invertible ASP signal output in the spatial frequency domain;

the ASP response output subtractor component is characterized by performing a subtraction of at least two ASP response outputs having complementary offsets;

the image processing system further includes at least one lens element disposed axially on an input side of the at least two ASP structures;

the image processing system further includes a plurality of lens elements and a respective plurality of diverse ASPs that have at least one of a different periodicity, orientation, phase, and spatial scale;

the plurality of lens elements are identical;

at least one lens element is disposed at other than a focal distance in front of the ASP structure, thus providing an out of focus illumination on the ASPs;

the at least two ASP structures have filter functions that substantially match the basis functions of a two-dimensional Fourier transform, and the at least two ASP structures form a Fourier array such that they further form a complete or over-complete basis set in frequency-space up to a maximum spatial frequency;

the at least two ASP structures have filter functions that match the basis functions of a two-dimensional Hartley transform, and the at least two ASP structures form a Hartley array such that they further form a complete or over-complete basis set in frequency-space up to a maximum spatial frequency;

the image processing system includes a plurality of Fourier arrays;

the image processing system is integrally disposed in a CMOS component;

the image processing system is a CMOS-based camera having micron-scale image processing components.

An embodiment of the invention is an image processing method that is carried out in the optical domain. The image processing method includes the steps of providing at least two, complementary, angle sensitive pixel (ASP) structures, obtaining a spatial frequency domain ASP output including a plurality of complementary ASP response (signal) outputs, in response to an optical input, performing a wavelet-like transform of the ASP response outputs in the optical domain prior to performing any operation in a digital domain (e.g., transducing, filtering, digitizing, etc.), and obtaining a desired output of the optical input. According to various non-limiting aspects of the embodied method:

the step of performing a wavelet-like transform of the ASP response outputs in the optical domain further involves performing a subtraction of at least two of the complementary ASP response outputs;

the step of obtaining a desired output of the optical input further comprises obtaining at least one of an optical image of the optical input, an object recognition of the optical input, a motion direction detection of the optical input, an edge detection of the optical input, an optical flow detection of the optical input, a biometric detection of the optical input, a text extraction of the optical input, a texture detection of the optical input;

the step of obtaining a desired output of the optical input further includes inverting the subtracted ASP output with or without rounding of those outputs the step of providing at least two, complementary ASPs further includes providing at least two diverse ASP structures that have at least one of a different periodicity, orientation, phase, and spatial scale;

the image processing method further involving obtaining an invertible ASP signal output;

the image processing method further involving the step of disposing at least one lens element on a light input side of the at least two ASP structures and providing a defocused lens element output of an object light as the optical input to the at least two ASPs;

the image processing method further involving the step of disposing a plurality of lens elements on a light input side of a respective plurality of diverse ASPs that have at least one of a different periodicity, orientation, phase, and spatial scale;

the image processing method further involving disposing a plurality of identical lens elements on a light input side of a respective plurality of diverse ASPs that have at least one of a different periodicity, orientation, phase, and spatial scale;

the image processing method further involving providing at least two, complementary ASP structures having filter functions that substantially match the basis functions of a two-dimensional Fourier transform, wherein the at least two ASP structures form a Fourier array such that they further form a complete or over-complete basis set in frequency-space up to a maximum spatial frequency;

the image processing method further involving providing at least two, complementary ASP structures having filter functions that match the basis functions of a two-dimensional Hartley transform, and the at least two ASP structures form a Hartley array such that they further form a complete or over-complete basis set in frequency-space up to a maximum spatial frequency;

the image processing method further involving providing at least two, complementary ASP structures integrally disposed in a CMOS component;

the image processing method further involving performing a wavelet-like transform of the ASP response outputs in the optical domain prior to performing any operation in a digital domain, using no electrical or externally generated power.

The angle-sensitive pixel (ASP) structures referred to herein, as well as their principle of operation, are fully discussed in PCT/US2009/051660, the subject matter of which is incorporated by reference herein to the fullest allowable extent.

It is to be understood that both the foregoing general description and the following detailed description are merely exemplary of the embodied invention, and are intended to provide an overview or framework for understanding the nature and character of the invention embodiments as they are claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF EXEMPLARY EMBODIMENTS OF THE INVENTION

Reference will now be made in detail to the present exemplary embodiments of the invention, examples of which are illustrated in the accompanying drawings.

Figure 1:
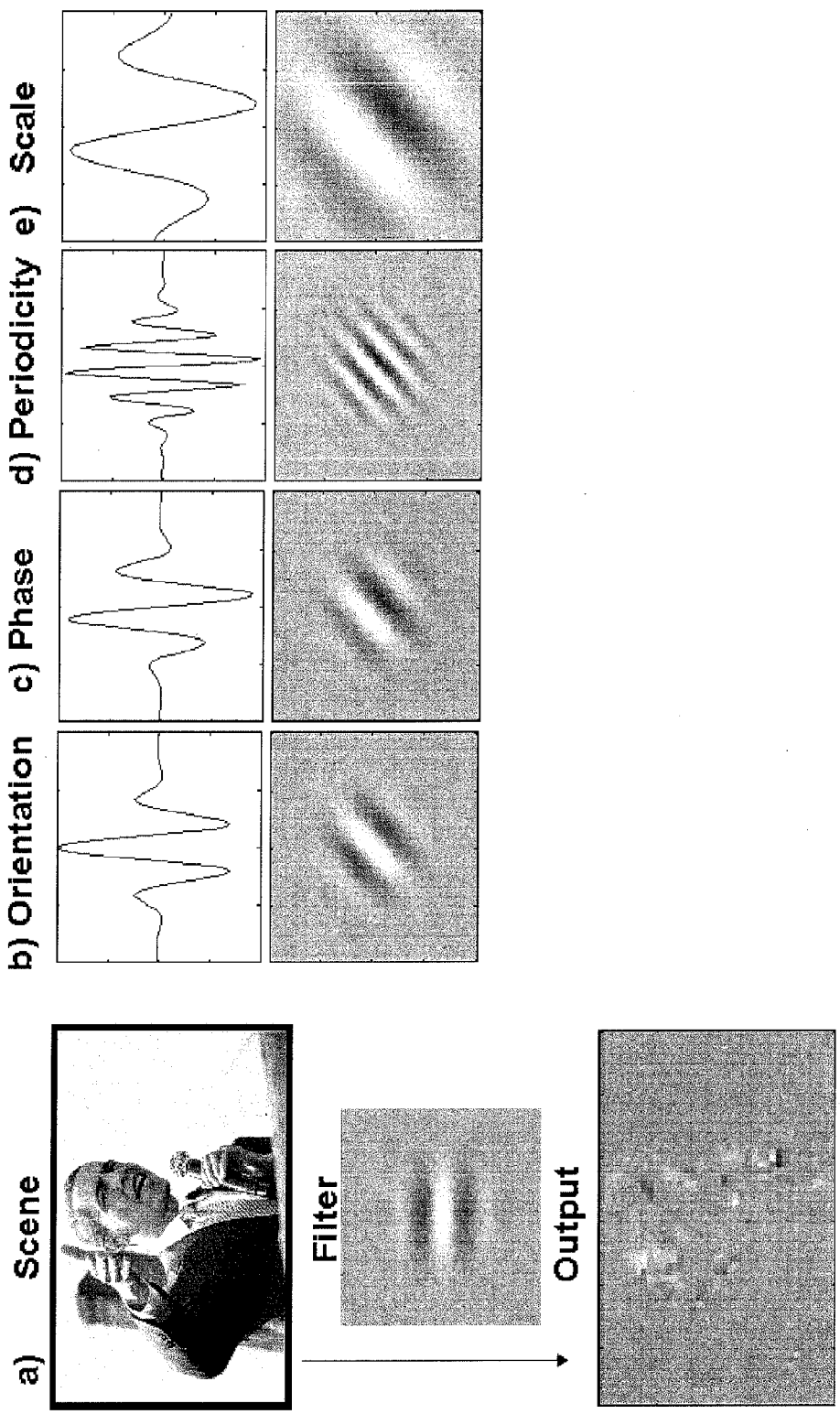
FIG. 1: Example Gabor Filters. a) A picture of a man (top, originally 1250×800 pixels, shrunk here to save space) convolved with single type of Gabor filter (middle, $\sigma$=10 pixels, a=9 pixels$^{-1}$), sampled at 20 pixel intervals, results in a sparse output (bottom), mid-tone grey has value 0; b-e) alternative Gabor filters, demonstrating the different parameters that can be varied; Top: 1-D projection sinusoidal component; Bottom: 2-D projection, grey=0, black=−1, white=+1.
Figure 3:
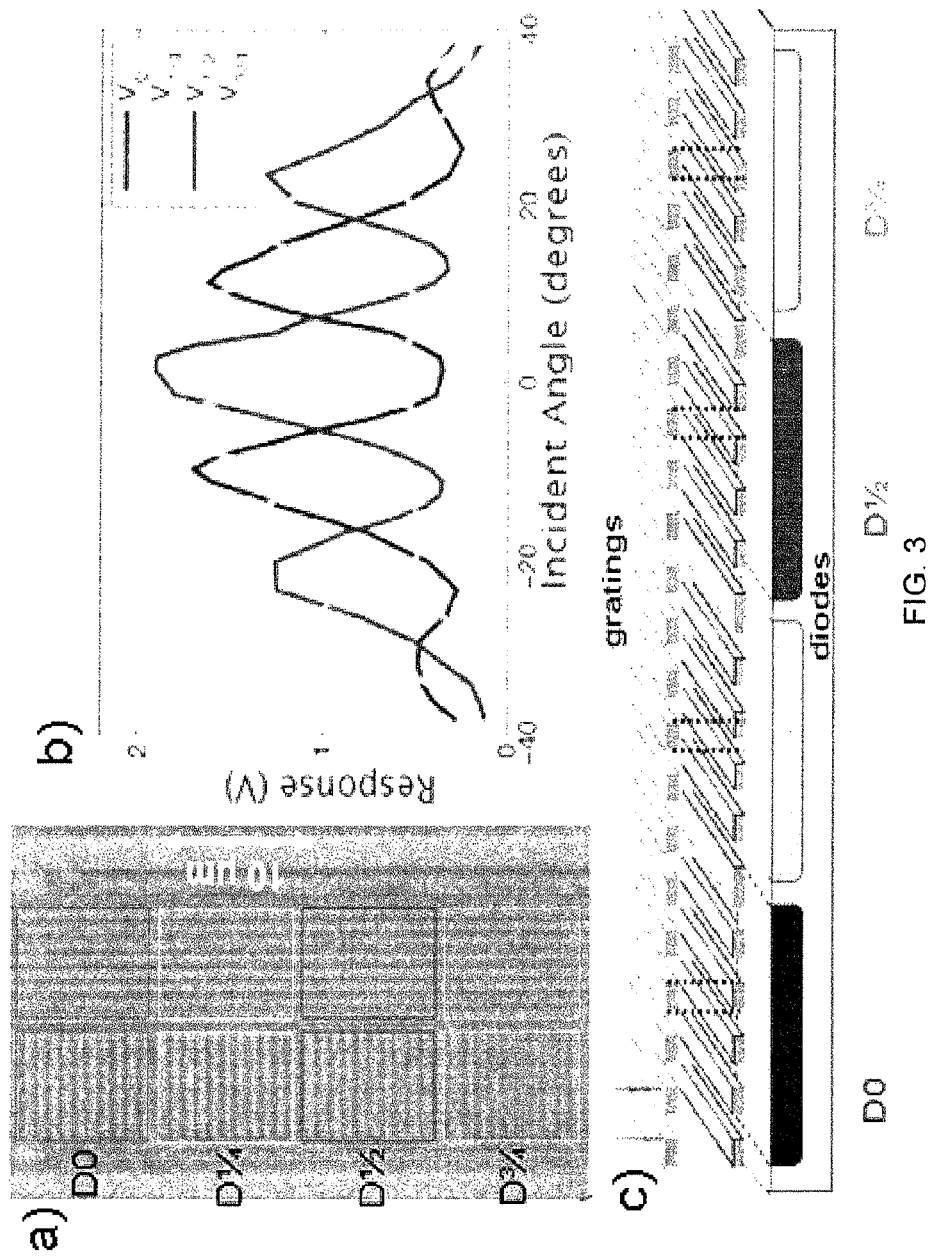
FIG. 3: Manufactured ASPs: a) Micrograph of a block of heterogeneous ASPs with vertical and horizontal sensors; b) Measured outputs from structure in (a) showing complimentary offsets in response; c) Cross-section showing different offsets between primary grating and analyzer grating.
Figure 4:
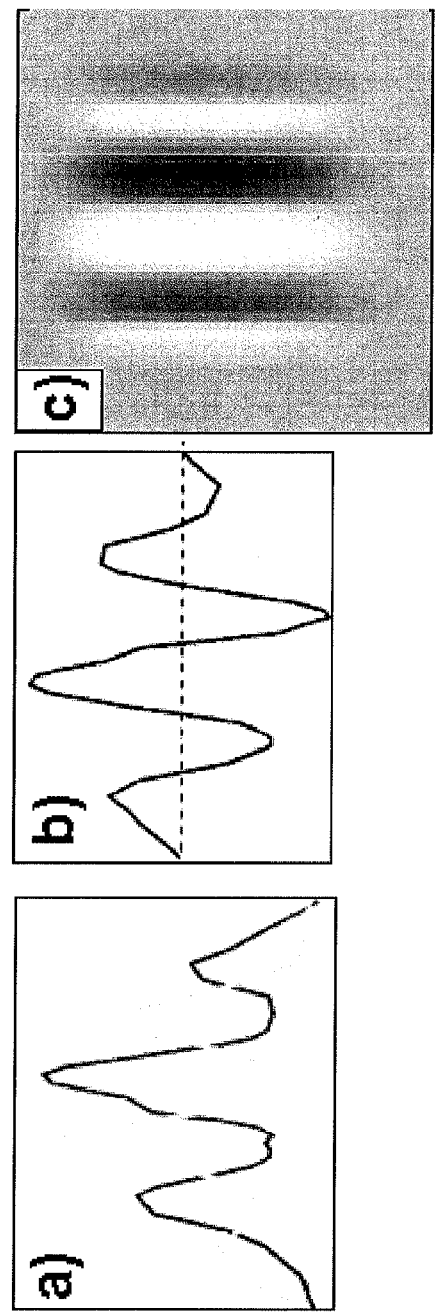
FIG. 4: Mapping ASP outputs to Gabor filters: a) Angle responses of Complementary ASPs; b) their difference; c) projected into 2-dimensions, according to an illustrative aspect of the invention.

Although ASPs were initially invented for 3-D micro-imaging, the inventors have discovered that ASP responses have a surprising similarity to Gabor filters. Subtracting ASP outputs with complementary offsets (e.g., $V_{1/4}$ and $V_{3/4}$ in FIG. 3b) yields a response strikingly similar to a Gabor filter, as can be seen by comparing FIG. 1 and FIG. 4, which shows the mapping of complementary ASP outputs into a two-dimensional depiction of a Gabor filter (4c). This suggests that the intrinsic properties of ASPs can be used to perform Gabor filtering optically, in the pixels themselves.

From this follows a non-limiting exemplary embodiment of the invention that pertains to a lensless image capture apparatus and method, where light is captured by a heterogeneous array of ASPs whose combined outputs contain significant image information. A non-limiting aspect of this embodiment is an array of ASPs implementing a 2-D Fourier transform of the visible scene.

Lensless Image Capture and Analysis Based on ASPs

Light from different parts of a scene will strike the surface of the ASP chip from different incident angles, with each angle corresponding to a particular location of the scene. Thus, using an ASP to filter the light based on incident angle is equivalent to filtering different parts of the scene based on spatial location. This implies that, just as diverse Gabor filters applied to the same region of an image extract different pieces of information, an array of diverse ASPs will extract different pieces of information (provided objects are distant relative to the physical size of the array). Each ASP maps to a specific filter, and if each of these filters is linearly independent from the others, the outputs of the array can be inverted to return the original scene. An illustrative aspect of this is to choose a set of ASPs whose filters match the basis functions of a 2-D Fourier transform. Such a "Fourier array" is extremely compact and provides outputs that are ideal for simple analyses such as, e.g., global optical flow and computing sun angle for geolocation.

Figure 2:
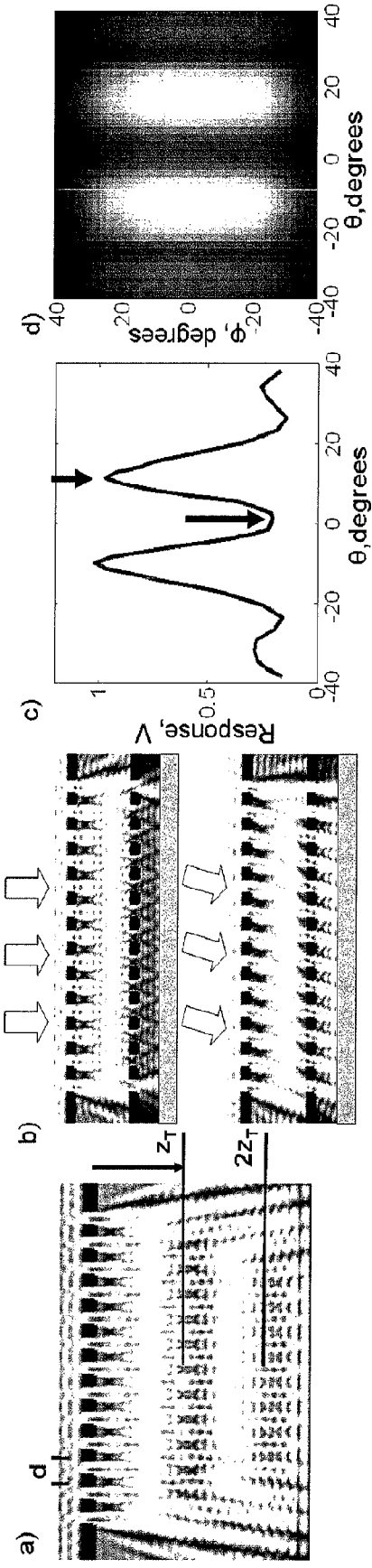
FIG. 2: ASP operation: a) FDTD simulations of plane waves striking a single grating of pitch d, generating periodic self-images at multiples of $z_T$; b) FDTD simulations of stacked gratings at different incident angles; c) Measured light transmission across incident angle; d) 2-D map of transmission.
Figure 5:
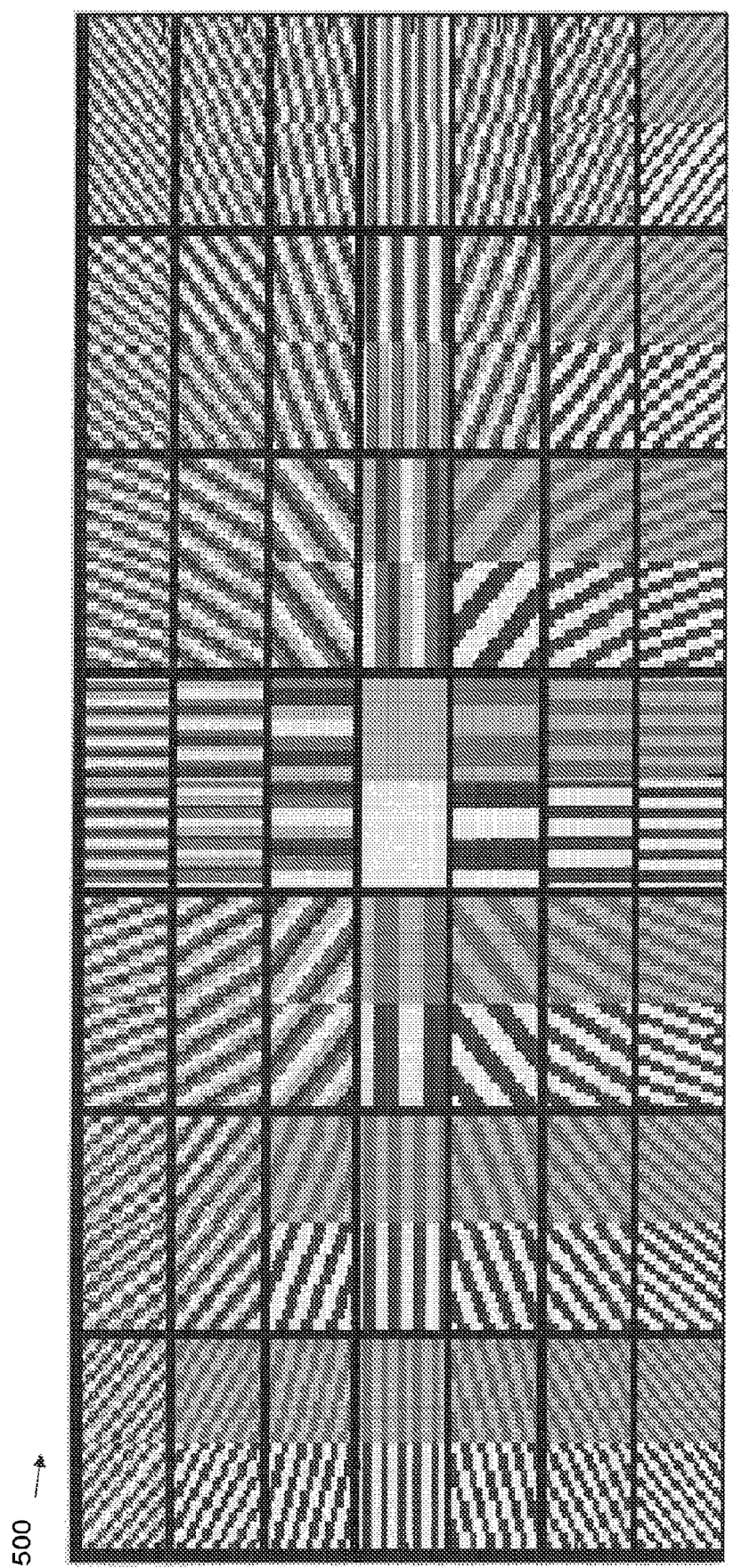
FIG. 5: Layout of a Fourier array comprising 98 ASPs: dark grey represents primary gratings; light grey, analyzer gratings. Central ASPs have largest grating pitch and respond to lowest spatial frequencies; higher spatial frequencies require more orientations. For each pitch and orientation, 4 phases are present, according to an exemplary embodiment of the invention.
Figure 7:
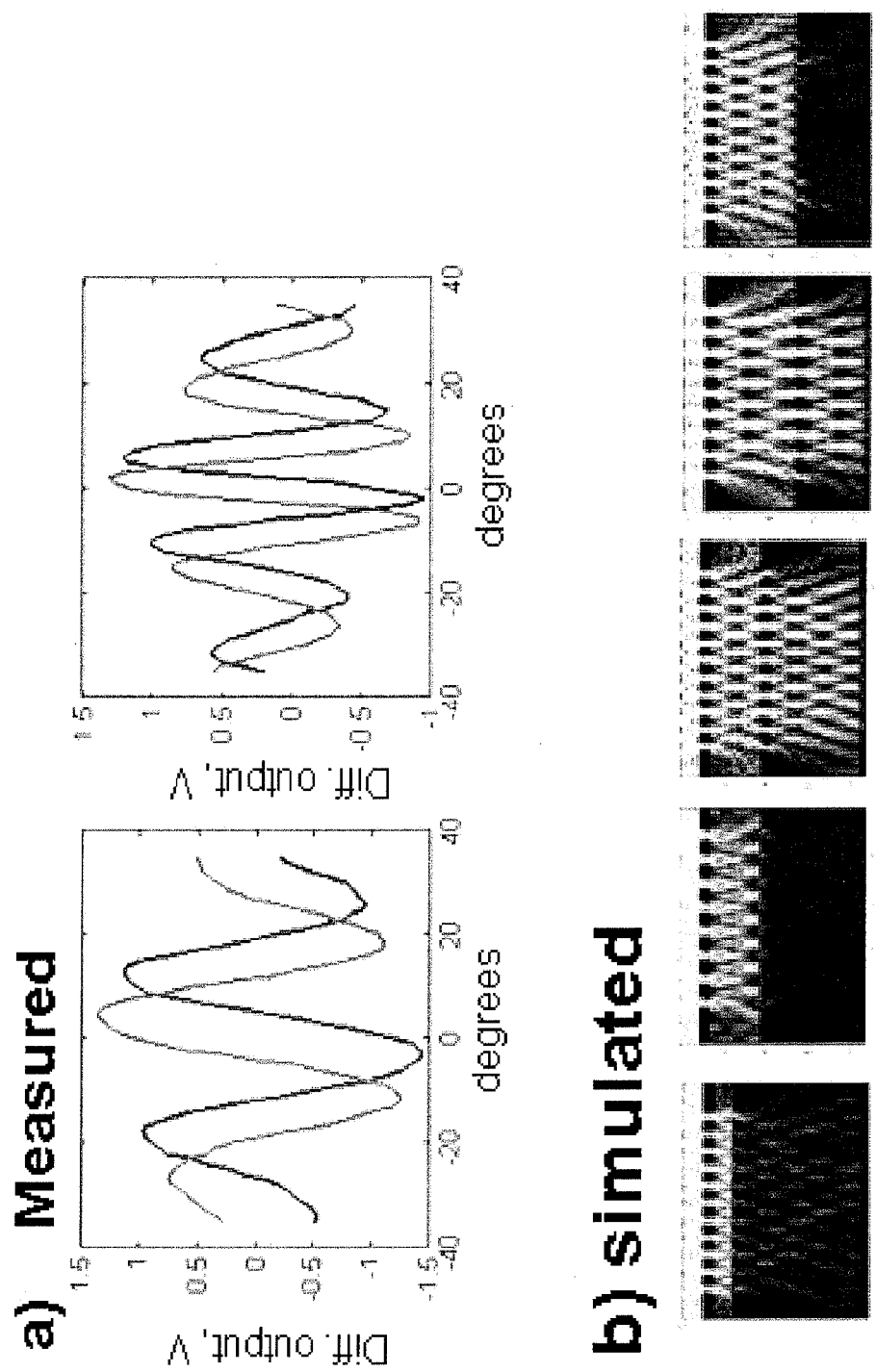
FIG. 7: Diversity in periodicity: a) Measured outputs of ASPs where the analyzer grating was placed at $z_{T(left)}$ or $2z_{T(right)}$. Curves are the difference of complimentary outputs, two phases are shown; b) FDTD simulations showing various implementations of ASP (top) resulting in various periodicities (bottom), according to an illustrative aspect of the invention.

The basic structure of an exemplary "Fourier array" 500 is shown in FIG. 5. Each ASP has an angular response of form:

$$I = I_o A(\sqrt{\theta^2 + \phi^2})(1 - m \cos(a\phi + b\theta + \alpha)), \quad (4)$$

where the values of a and b depend on the orientation of the gratings as well as their pitch and vertical spacing. To provide a Fourier-like transform, a and b must tile 2-D frequency space. For each combination of a and b, four ASPs are needed, with a $\pi/2$ phase-split such as shown in FIG. 3b. Subtracting complimentary signals then yields sine and cosine terms at each frequency and orientation of the 2-D Fourier transform. a and b from eq. 4 can be treated as Cartesian coordinates that map to the polar coordinates of orientation and periodicity of the response (i.e., $\beta$ of Eq. 3). The orientation of an ASP's response simply tracks the orientation of its grating, which can be designed for any angle (since the grid spacing in modern CMOS processes is much less than the wavelength of light). To change periodicity, grating pitch (along with the depth of the analyzer grating) can be adjusted, or alternately, the analyzer grating can be placed at a higher order Talbot distance. FIG. 7a shows measured results from two ASP test structures whose analyzer gratings were placed at $z_T$ and $2z_T$ (from FIG. 2). FIG. 7b shows FDTD simulation results for ASPs that provide a range of periodicities by varying pitch as well as analyzer grating depth.

The effective imaging resolution of a Fourier array will be limited by the highest periodicity attainable; specifically, the smallest angular spot separation that can be resolved is $\pi/2\beta$. This limit, in turn, is set by the minimum pitch and maximum separation of gratings possible in a given process. We simulated a maximum $\beta$ of about 50, corresponding to a resolution of 0.031 radians, or 1.8 degrees. At these high $\beta$ values, the wavelength dependence of $z_T$ starts to have a significant effect and so, Fourier arrays may benefit from wavelength isolation in their photodiodes or be coated in a color filter similar to those used in digital cameras to reduce the range of wavelengths analyzed. One aspect is multiple Fourier arrays, each tuned to a different wavelength. This is reasonable because Fourier arrays can be very compact; i.e., each ASP is <10 µm on a side, and thus only about 1200 are needed for a complete array with $\beta$ limited to 50 or less (assuming a field of view of about 70 degrees), implying an array size of 230 µm×460 µm.

While very compact and simple, a Fourier array will not tend to provide a very sparse representation of real scenes. This is because every output takes the entire scene as input, and so objects anywhere in the scene affect all of the outputs. However, to provide significantly higher resolution, we will use one or more lenses in conjunction with the ASP apparatus, described further herein below.

Using Lenses to Amplify Angle and Generate Arrays of Gabor-Like Filters

Figure 6:
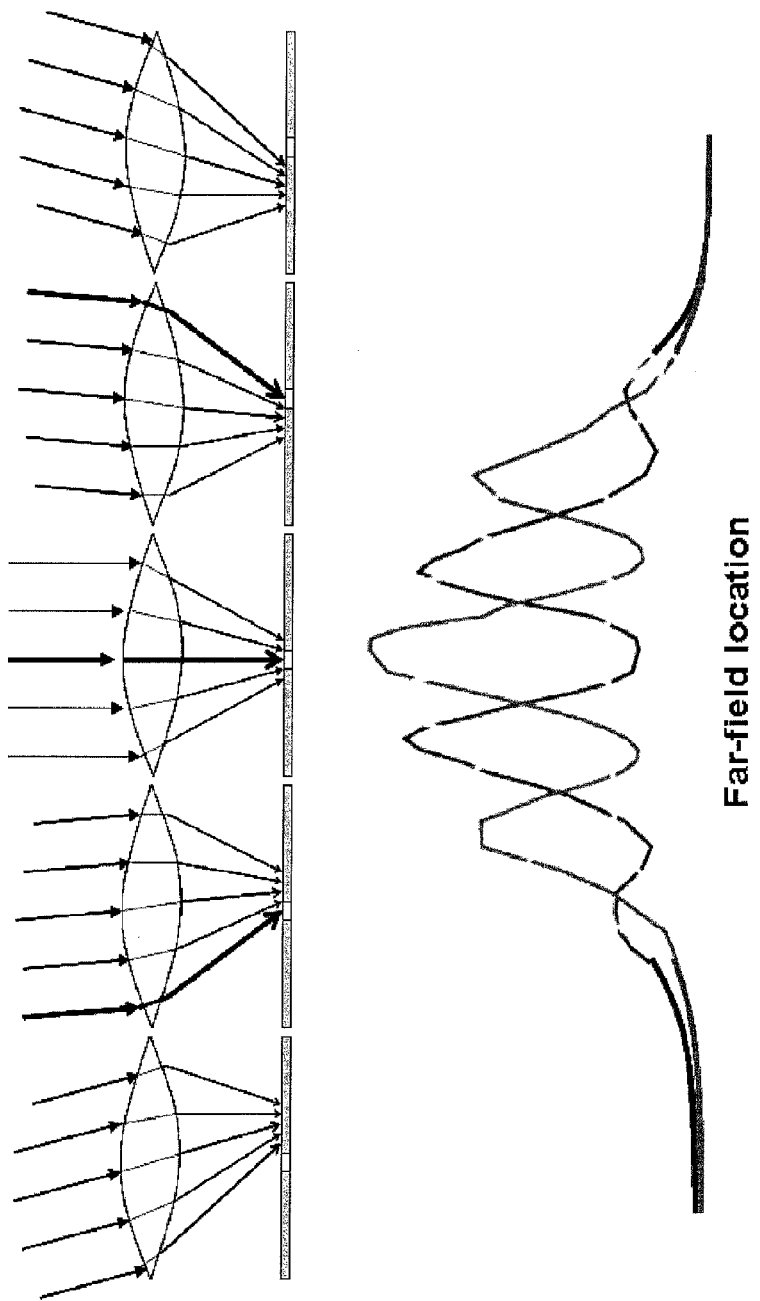
FIG. 6: A lens over an ASP array leads to wavelet-like encoding of the far-field scene (note that for a true wavelet, opposite sign signals must be subtracted, i.e., blue curve subtracted from red, according to an illustrative aspect of the invention.

A small heterogenous array of ASPs performing a low order 2-D Fourier transform (e.g., for N=3) can be tiled to form a larger array of the "Fourier pixels". Placing this array behind a convex lens, but slightly out of focus, will expose each Fourier pixel to only a narrow range of the visual field, with significant amplification of incident angles, providing a local, low-order Fourier transform of each region of the visual field (see FIG. 6). Put another way, looking again at FIG. 3b, one can notice that the curves bear a lot of similarity to a Gabor wavelet transform. Specifically, Gabor wavelet-like transforms can easily be extracted by subtracting (in analog hardware) the anti-phase outputs (i.e., $V_{1/4}$ and $V_{3/4}$, see FIG. 4). Since Gabor wavelets are a function commonly used in image compression and feature extraction, this structure can be used to perform a wavelet transform of images in the optical domain as those images are captured, extracting features at no computational cost. This is accomplished by placing an array of ASPs slightly above (or below) the focal plane of a lens. The lens acts to map the far-field angle to local regions on the array, while simultaneously amplifying deviations of that angle. The ASPs then convert these blurred, inhomogeneous angles into a wavelet-like output, as shown in FIG. 6. If the ASPs are arranged into Fourier pixels, and the blurring provided by the out-of focus lens is of similar scale to the spatial extent of the Fourier Pixels, then the various outputs of the array will be roughly orthogonal and will span the same space as a normal imager.

Figure 8:
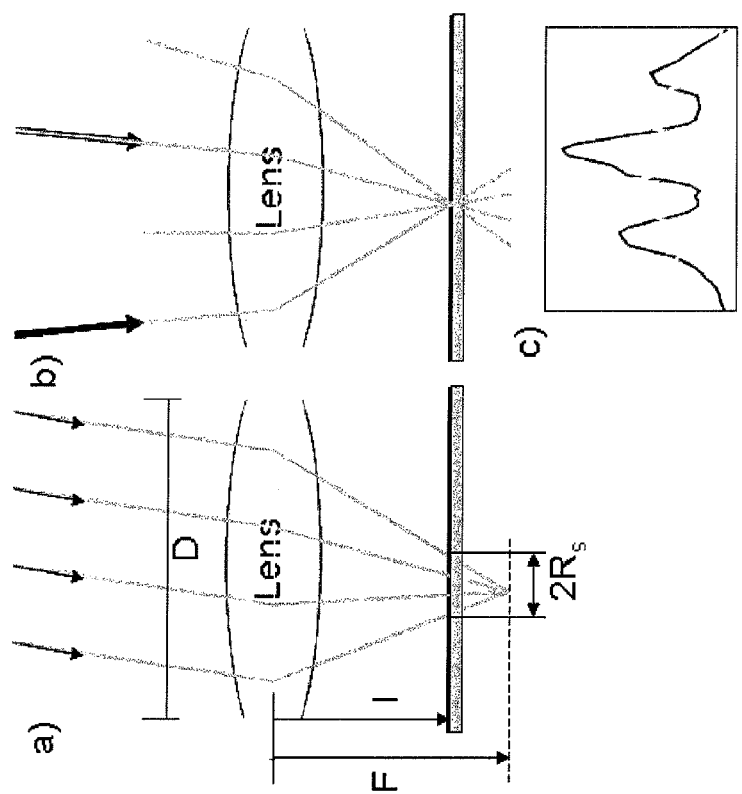
FIG. 8: Lens as angle amplifier: a) Basic lens arrangement over ASP array (grey rectangle) with relevant dimensions labeled; b) This arrangement takes light from a small range of angles and amplifies their angle such that, as shown in c), these different incident angles map onto ASP filter responses, according to an illustrative aspect of the invention.

In order to generate a complete filter bank, multiple types of ASPs must be used. An advantageous approach useful to increase resolution is to amplify angular differences with a lens before projecting light onto an array of ASPs, as shown in FIG. 8. At the same time, the finite aperture of a lens implies that each ASP on the array will apply its filtering properties on a small region of the overall scene of the external scene, similar to a Gabor filter. An array of identical ASPs will filter across the whole scene, performing an operation similar to that shown in FIG. 1a.

Figure 9:
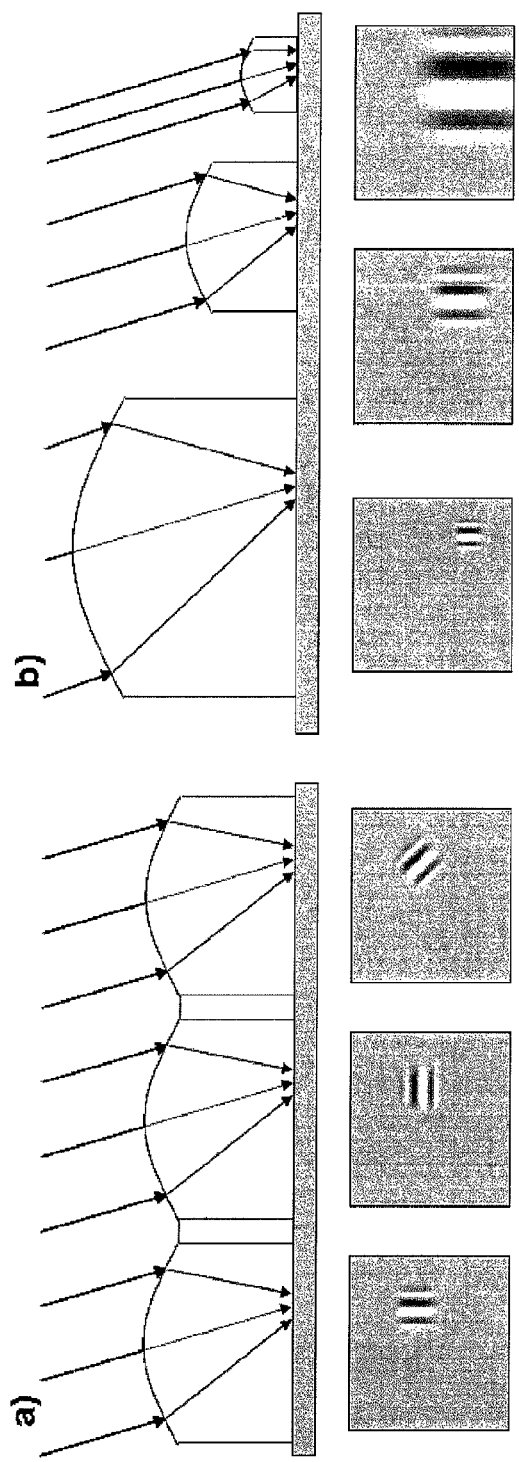
FIG. 9: Two alternative multi-lens designs: a) multiple identical lenses are arranged over multiple ASP arrays, each made up of different kinds of ASPs (here, e.g., with different orientations); the ensemble of arrays provides a full diversity; b) Multiple, differently dimensioned lenses, which project the same sized spot on the same types of ASPs, each lens provides a distinct angular gain, scaling, otherwise identical filters, according to an illustrative aspect of the invention.

In order to generate a complete filter bank, multiple types of ASPs should be used. One approach is to tile small Fourier arrays behind a single lens, to perform a version of block-level processing. An alternative, more compact technique is to create small homogenous arrays of ASPs, each with its own lens, but each made up of a different type of ASP (i.e., diverse ASPs), as shown in FIG. 9a, which provide the same overall filtering but with smaller volume and easier post-processing. In another aspect, a multi-lens approach provides an additional source of diversity by allowing for different types of lenses, providing different angular gain, and different overall filter scale, as shown in FIG. 9b and described further below. Adding control of this parameter opens up a much wider range of Gabor-based image processing based on scale-invariant wavelets.

It is advantageous to arrange the lens and ASP array such that the distance from the lens to the plane of the array (I) is less than its focal depth (F) (see FIG. 9a). In this arrangement light from a single direction generates a defocused spot on the array which covers multiple ASPs. This spot's radius will depend on F, I, and each lens aperture, D, as $$R_s = D(F-I)/2F \quad (5)$$

This in turn implies that each ASP will receive light that originates from a range of angles in the outside world, but that the variation in those angles is significantly amplified by the lens, effectively increasing resolution by a gain factor, $G_\theta$, as $$G_\theta = D/2R_s = F/(F-I) \qquad (6)$$

Conversely, each ASP only receives light from a subset of the angles that impinge on the lens, corresponding to an arc of $$\theta_{max} - \theta_{min} = 2R_s/I = D(F-I)/2FI. \qquad (7)$$

Therefore, each ASP output resembles a Gabor-filtered version of a region of the visible scene. To cover the whole scene, each ASP type is repeated at a pitch less than or equal to $2R_s$. Using a single lens and providing a complete description requires multiple ASP types, arranged in blocks of dimension $<2R_s$. The lens may be of similar dimensions to the array, and at a similar distance away, resulting in an overall camera with a volume of approximately the linear dimension of the array cubed.

An alternative arrangement is shown in FIG. 9b, where different ASP types are placed in arrays under different, varying (smaller) sized lenses, which provide angular gain to each ASP type separately. Since the full set of filters is still present when all of the array outputs are included, the effective resolution of the system is unchanged, but the physical volume is much smaller.

Such a lens array could also be used to provide variable angular gain, $G_\theta$. By adjusting F, I and D of each lens so that $G_\theta$, is varied but Rs (from Eq. 5) is held constant, we can use the exact same ASPs while generating filters with very different spatial scales, essentially adjusting σ from Eq. 1 (such as shown for a Gabor filter, in FIG. 1e). This ability to adjust spatial scale will allow for a filter bank with "scale invariance," a property key to both to enhancing sparseness, but also advantageous for a variety of known scene analysis and recognition techniques. Thus diverse lenses provide control the one important parameter in a Gabor transform that cannot be adjusted in the design of the ASPs themselves.

With this approach each ASP will see a convergent wavefront, rather than a plane wave input. However, these ASPs can be adjusted to account for this by analyzing the convergent Talbot effect and scaling the pitch of the analyzer grating relative to the primary grating to account for convergence effects.

Figure 10:
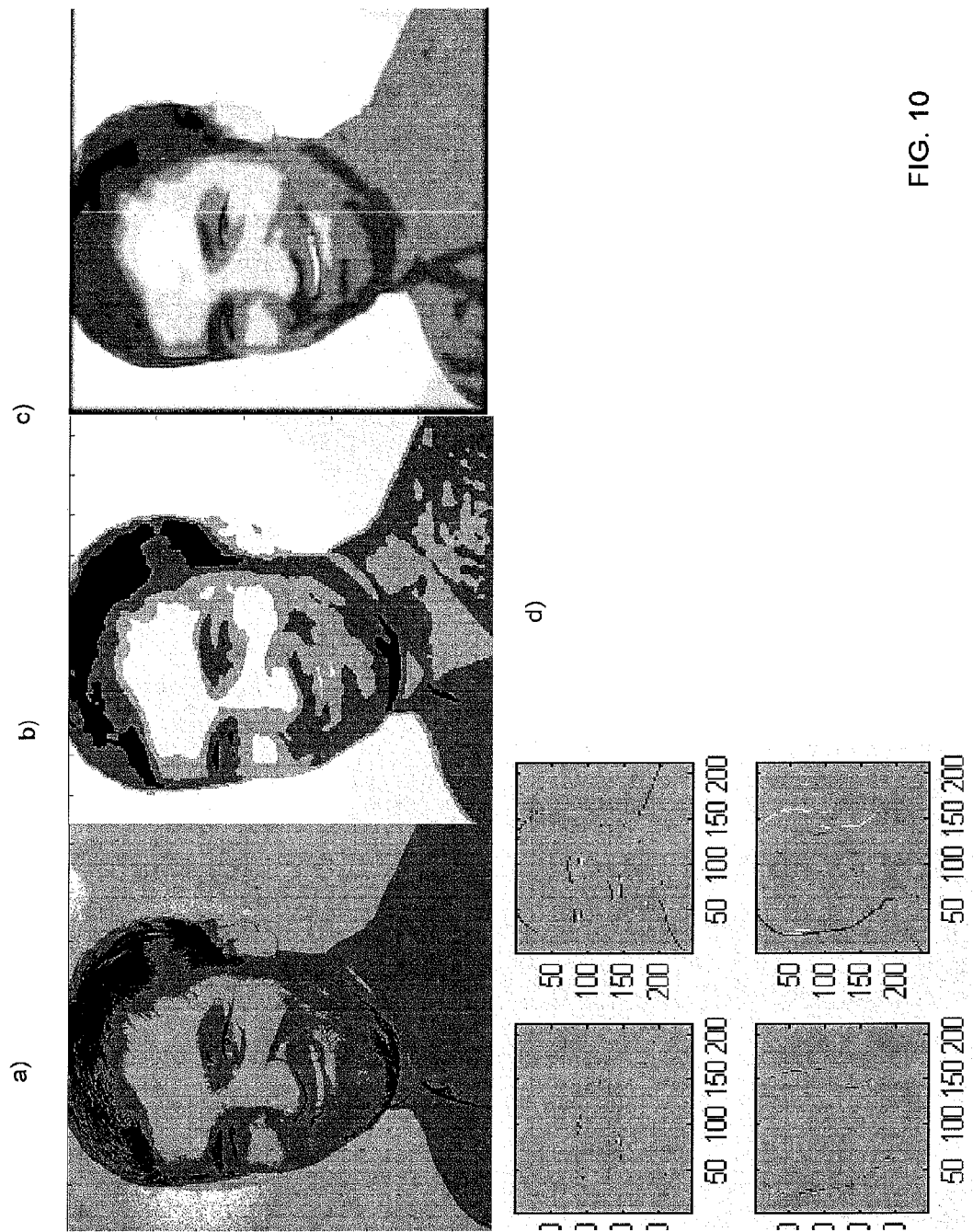
FIG. 10: Face under different compression tricks: from left to right: a) descretized to 5 levels, blurred, sub-sampled by 4× in x and y directions, then descretized; b) blurred but fed to model of Fourier pixel (N=2), followed by descretization (reconstructed image made by pushing descretized outputs through matched filters). Each version was compressed using TIFF; c) blurred/subsampled file was 1/10 size of basic descretized file, Fourier pixel model was 2× size of pure blurred, but actually provided much better quality than either of the other two; d) outputs of some of the ASPs, note both the sparsity of the responses, and their selective responses to edges and other "interesting" features (eyes, mouth), according to an illustrative aspect of the invention.

A significant benefit of wavelet transforming a scene or video is that the features represented by each wavelet are individually more informative than individual pixels. For compression, the main benefit is that the outputs of a wavelet transform are much sparser than normal pixels. Specifically, in a typical scene, most wavelet outputs will be very close to zero (see FIG. 10 for an example of this). These long runs of zeros can easily be dramatically compressed (in run-length encoding, for example). Similarly, a wavelet transformed image is often more amenable to a high degree of descretization without significant loss of quality, as compared to simply descretizing pixels. Alternately, to return to the analogy with early visual processing in the brain, these wavelet-like features provide natural detectors for edges, aiding scene parsing, and provide natural primitives for computing more complex visual phenomenon such as directional motion. Much of the added computations described here (descretization, run-length encoding, motion detection) can be implemented very efficiently on-chip, using the outputs of Fourier pixels as their inputs, further reducing computational expenses.

Gabor (or Fourier) transformed images are also much more easily processed in ways other than simple compression. Two examples of such processing are in motion estimation and scene analysis based on scene statistics (which are often directly measured by Fourier transforms). Thus the instant invention is not limited to image compression, but can also be combined with custom on-chip circuitry for very efficient motion and scene analysis.

Figure 11:
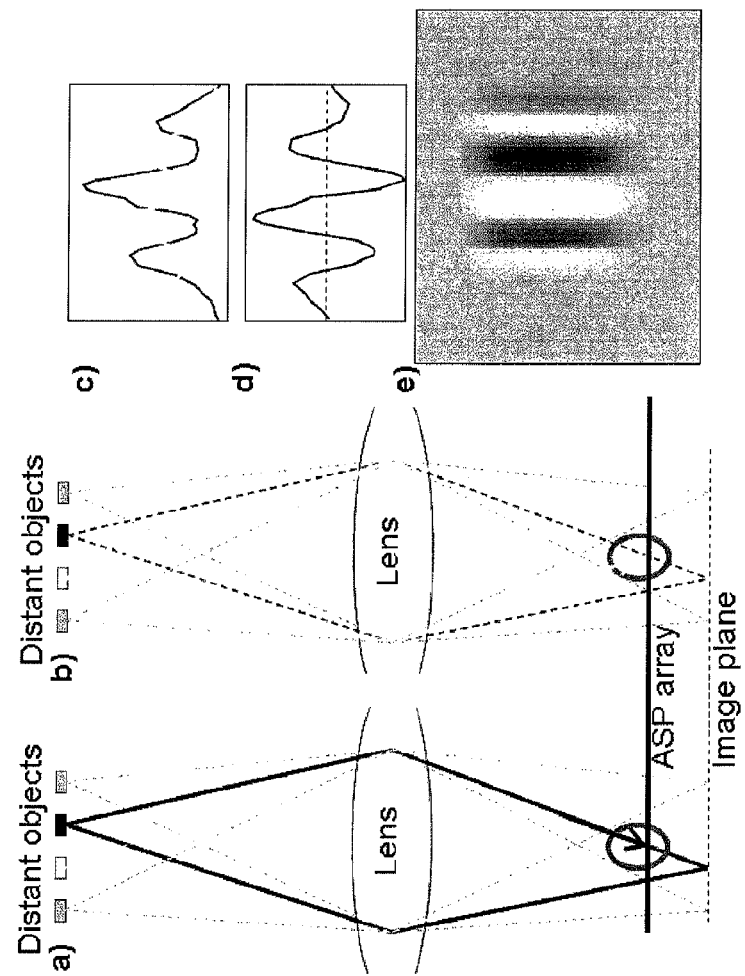
FIG. 11: Optical setup: a) A distant object (blue) projects a blurred image on the ASP array, which is in front of the focal plane of the lens; b) A second object (green) presents an overlapping blurred image on the ASP array. However, because their angles are distinct, ASPs (inside the red oval) respond differently to them; c) Two adjacent, complimentary ASPs preferentially respond to different angles, and so to different locations in space; d) Subtracting the outputs of these filters provides a Gabor-like spatial filter as seen in (e), according to an illustrative aspect of the invention.

An aspect of the present invention is to make use of the filtering properties of ASPs to build a CMOS camera that performs V1-like image processing in the optical domain. To do this, we need to translate the local position of light sources in the visual field into incident angle at the location of a given ASP. Such a transformation can be performed by a convex lens with its focal plane slightly behind the plane of the ASP array, as illustrated in FIGS. 11a,b. In this arrangement each ASP will see a region of the scene, but will see different spatial locations within that region as coming from different angles. The ASP filters these angles differently, and will map its filter properties onto the region of space it can see. The resultant spatial filter will look very similar to the Gabor filters described above, and so to the receptive fields of neurons in V1.

True Gabor filters differ from ASP responses by containing both positive and negative regions; similarly, neurons in V1 are excited by light in regions, and suppressed by light in others. These positive and negative regions are balanced, such that the cells respond weakly to uniformly bright scenes. Although simple ASPs have strictly positive responses, one can construct two adjacent sensors whose responses are complementary (i.e., the red and blue traces in FIG. 3b). Subtracting complementary signals yields responses that contain both "positive" and "negative" regions (FIG. 11d, e) (similar cross-subtraction also occurs in the mammalian visual system). Subtraction can be included at no cost in the buffering circuitry of each sensor. Both V1 and compression algorithms employ diverse filter arrays tuned to different spatial scales, orientations, and phases. Expanding on the variety of ASPs in FIG. 3a can provide this diversity. Full V1-like behavior can be replicated by using a fixed length lens to project a defocused image onto an array of ASPs with various periods, phases and orientations.

Integrated Optoelectronic Array Development

The embodied imaging apparatus can be implemented in the form of an array of ASPs with appropriate electronics, for example, in 180 nm CMOS (from MOSIS). This chip can be packaged and mounted into a camera (e.g., an off-the shelf web-cam or similar) whose optics provide the controlled blur needed to generate V1-like image processing.

One benefit of performing Gabor-like filtering in the optical domain is that it precedes analog-to-digital conversion. Compression algorithms such as JPEG2000 rely on spatial filtering (implemented in the digital domain) followed by scaling and quantization to reduce the number of bits required to encode an image. In the present implementation, spatial filtering precedes electronic buffering and digitization, such that scaling and quantization can be implemented by these circuits at no extra expense. The sparseness of the pixel outputs means that the analog-to-digital converter (ADC) can run at reduced resolution for many outputs, saving energy proportional to the compression ratio. When combined with a near-zero detector the ADC can be shut down for weak signals. This approach may reduce power consumption by at least an order of magnitude, and by more than 2 orders of magnitude relative to commercial solutions (see Table 1). Furthermore, power consumption will be proportional to compression ratio: the more an image is compressed, the less power will be needed to capture and compress it.

TABLE 1

Table 1: power consumption comparison

| Functionality | power | status | ref |
|---|---|---|---|
| JPEG + imager* | 198 mW | commercial | [13] |
| imager* | 60 mW | commercial | [14] |
| JPEG | 24 mW | commercial | [15] |
| JPEG | 8.3 mW | simulated | [16] |
| JPEG + Imager** | 15 mW | simulated | [16] |
| proposed work | 1 mW | proposed | |

Figure 12:
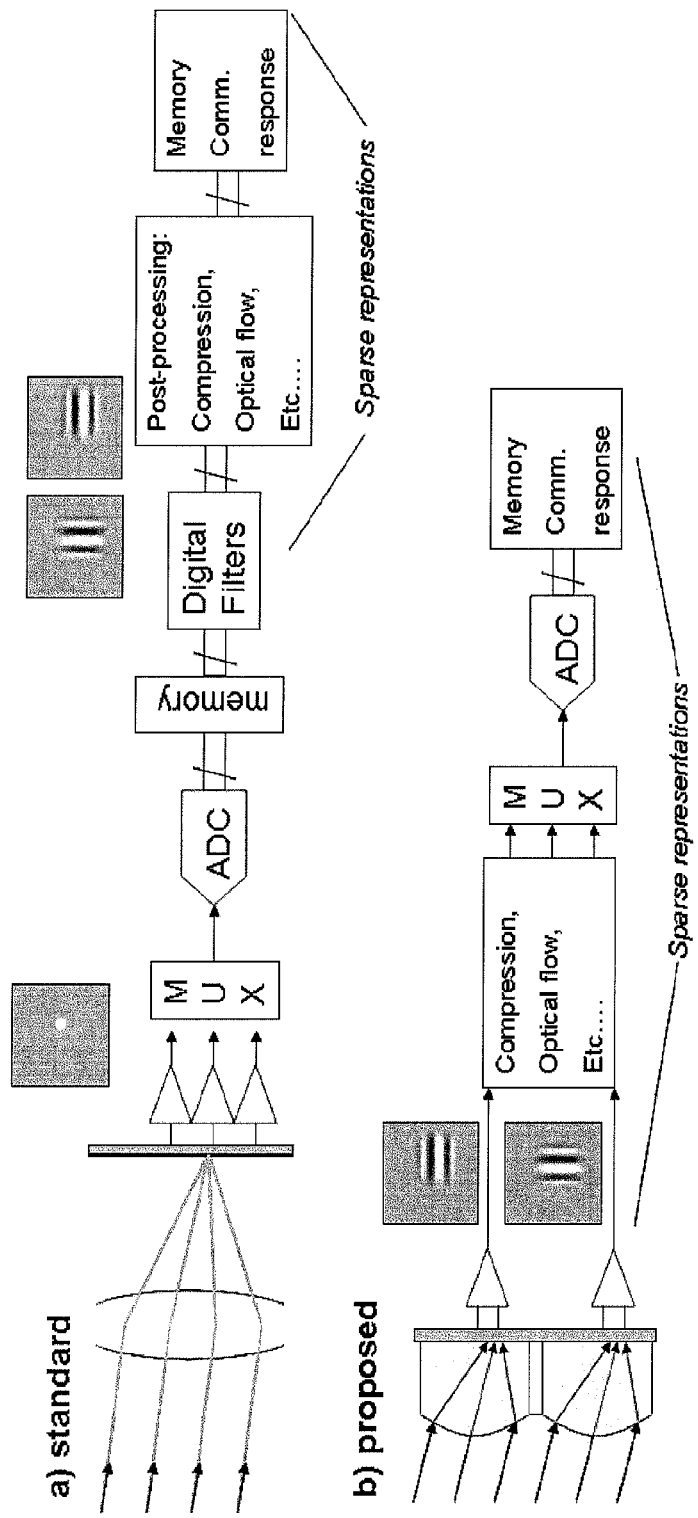
FIG. 12: Comparison of data paths in an imaging systems: a) Standard approach: individual pixels capture intensity at one point in space, which is buffered, digitized, and transformed (filtered) in the digital domain before further image processing; b) Apparatus to perform filtering at each pixel optically, permitting processing before digitization while saving at least an order of magnitude in power, according to an illustrative embodiment of the invention.

*normalized to VGA, 30 fps
**assumes the same circuits as proposed imager, but w/o reduced power from pre-ADC sparseness FIG. 12 schematically shows the comparative data paths and structural aspects of a typical standard image processing and the embodied invention. In FIG. 12a, individual pixels capture intensity at one point in space, which is buffered, digitized, and transformed (filtered) in the digital domain before further image processing. The inventive apparatus illustrated in FIG. 12b performs filtering at each pixel optically, permitting processing before digitization while saving at least an order of magnitude in power.

Figure 13:
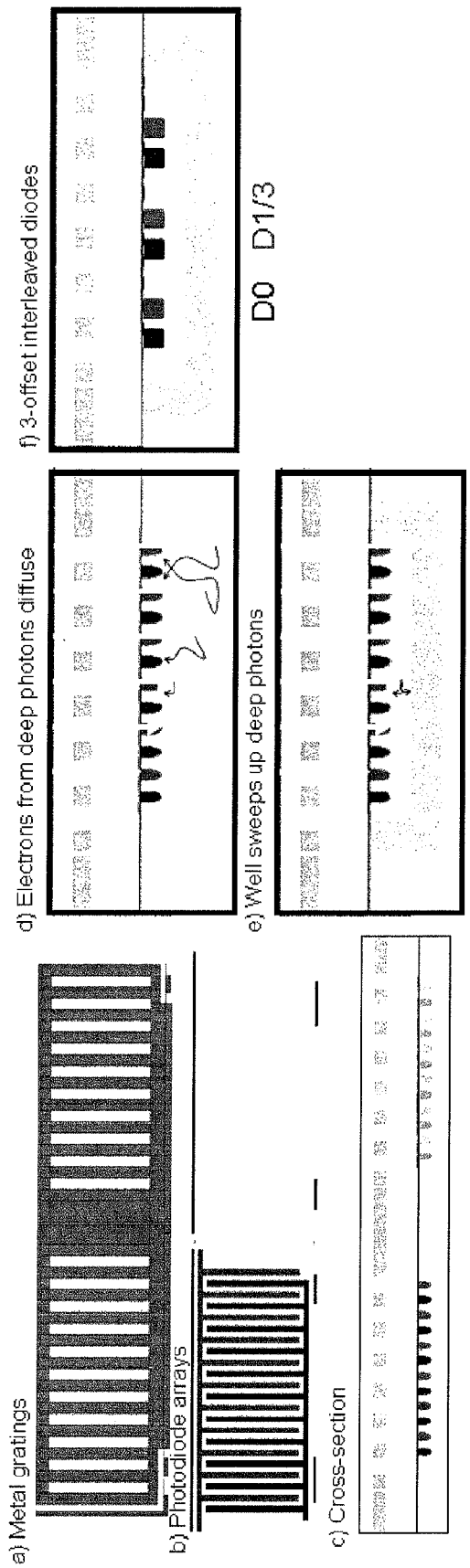
FIG. 13: Proposed ASP using interleaved diodes in place of analyzer grating: a, b) top views of grating, diodes-colors indicate different offsets, as in FIG. 3; c) cross section; d) Illustration of deeply penetrating photons generating carriers that diffuse to either set of diodes (red or blue); e) Embedding diodes in a deeper well absorbs carriers in or near the well's depletion region (violet); f) Alternate interleaved design with three wider diodes to capture three angles, according to an illustrative aspect of the invention.

Generating one Gabor-like filter requires two, complimentary ASPs. This could be improved by moving the analyzer function from a separate grating into the photodiodes themselves. Complimentary, interleaved photodiodes could be used to separately measure self images that are in-phase or out-of phase with the primary grating, as illustrated in FIGS. 13a-c. Including a second structure at a ¼ pitch offset would provide outputs analogous to those shown in FIG. 4c. FIG. 13f, illustrates an aspect that uses three distinct interleaved diodes. These three independent measurements suffice to extract everything about a simple Talbot self-image: total light intensity, self-image amplitude, and self-image offset. Such a structure could provide the ultimate in dense ASPs, while simultaneously increasing the pitch of the photodiodes for easier manufacturing.

Unfortunately, making interleaved photodiodes of pitch <0.5 μm means using shallow diodes (source/drain diffusions in CMOS). Since these diodes (also <0.5 μm) are significantly shallower than the penetration depth of visible light, much of the light will be absorbed deeper than the photodiodes themselves. The resulting charge carriers will diffuse some distance and have roughly equal chance of being absorbed by either photodiode, badly degrading their response (see FIG. 13d). This is a known problem with fine pitch photojunctions, and has limited other high-resolution imagers.

To avoid this problem, we propose placing the interleaved, shallow diodes in a deeper, more lightly doped well (see FIG. 13e). This deeper junction would shield the interleaved diodes from deep carriers, reducing blurring. Simple simulations indicate that for a reasonable CMOS process (at the 130 nm or 180 nm process node) approximately 30% of green light would contribute to angle-sensitive photocurrents, providing similar modulation depth (the coefficient m in eq. 2) compared to stacked amplitude gratings.

Back-End Circuits to Support End-to-End Visual Processing on Chip

Arrays of ASPs provide preliminary processing to encode scene information in compact, useful ways. However, to take full advantage of this compactness, some additional processing is highly advantageous and perhaps necessary. Because ASPs will be integrated alongside standard CMOS electronics, it makes sense to implement this additional processing on chip in custom mixed-signal circuitry.

Exemplary Circuits to Enhance Sparsity and Perform Image Compression:

For Gabor-like behavior, ASPs need to be constructed as complementary pairs of sensors, whose outputs are subtracted, as described herein above. This subtraction can easily be performed by a differential transistor pair as part of their local signal buffering. This combined structure will then act as a filter with roughly zero-mean. Since most scenes contain large regions of uniform intensity (a clear sky for example), the outputs of such filters will often be close to zero, providing a sparse output.

The benefit of this sparseness is that it means that many of the outputs can be rounded to zero without significant loss of information. If this round-off occurs early, any subsequent signal processing can be much lower power by simply vetoing it when the input is rounded to zero. Such a round-off could be performed by a simple window comparator (signals inside the window=0, others=1).

An analog-to-digital converter preceded by such a comparator could digitize many outputs as zero without actually performing a full conversion. If these zeros are then encoded efficiently, the result will be significant image compression by exactly the same principles that drive JPEG encoding, but with at least a 10×-100× reduction in power relative to the best present combinations of imager and encoder.

Adding the outputs of complimentary ASPs also provides useful information, essentially a "DC" term for any Fourier-like processing. However, since outputs from complimentary ASPs with different orientations, phases, and periodicities will all generate the same sum, these outputs can be significantly under-sampled without loss of information.

Figure 14:
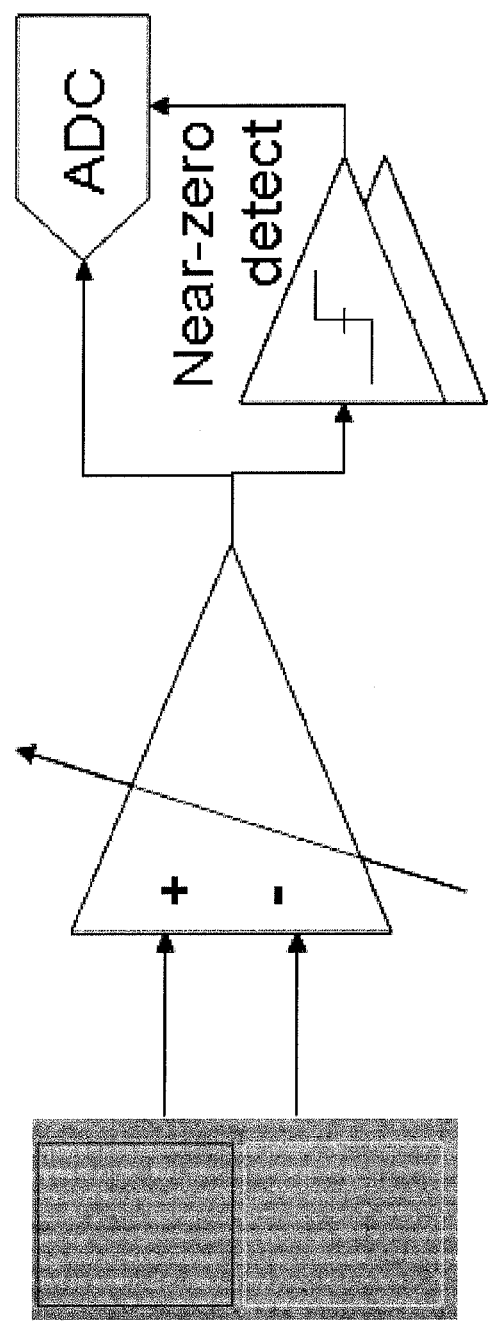
FIG. 14: Circuit schematic for built-in compression of ASP outputs, including variable gain difference amplification (to extract Gabor-like output) near-zero detect (also called "dead-zoning") to heavily compress weak outputs, and rounding incorporated into digitization, according to an illustrative aspect of the invention.

FIG. 14 schematically illustrates an exemplary back-end circuit. Complementary ASPs are subtracted and buffered through a programmable gain amplifier. If the resulting output is close to zero, this is detected and digitized as a zero, otherwise the ADC digitizes (and so rounds) the output.

ASPs also provide information ideal for computing directional motion, both in lensless Fourier arrays, and in more localized filtering. Using traditional methods, measuring this "optical flow" comes at significant computational cost, requiring the correlation of many individual pixels between frames. Using ASP signals with multiple phases (such as in FIG. 3), allows a much more compact measure of motion. Correlating the output of one complimentary sensor pair (e.g., $V_0$ and $V_{1/2}$) with the rate of change in the other ($V_{1/4}$ and $V_{3/4}$), provides an immediate estimate of the speed and direction of motion. Furthermore, only two such computations (one for horizontal ASPs, one for vertical ASPs) are required for a $1^{st}$-order estimate.

Figure 15:
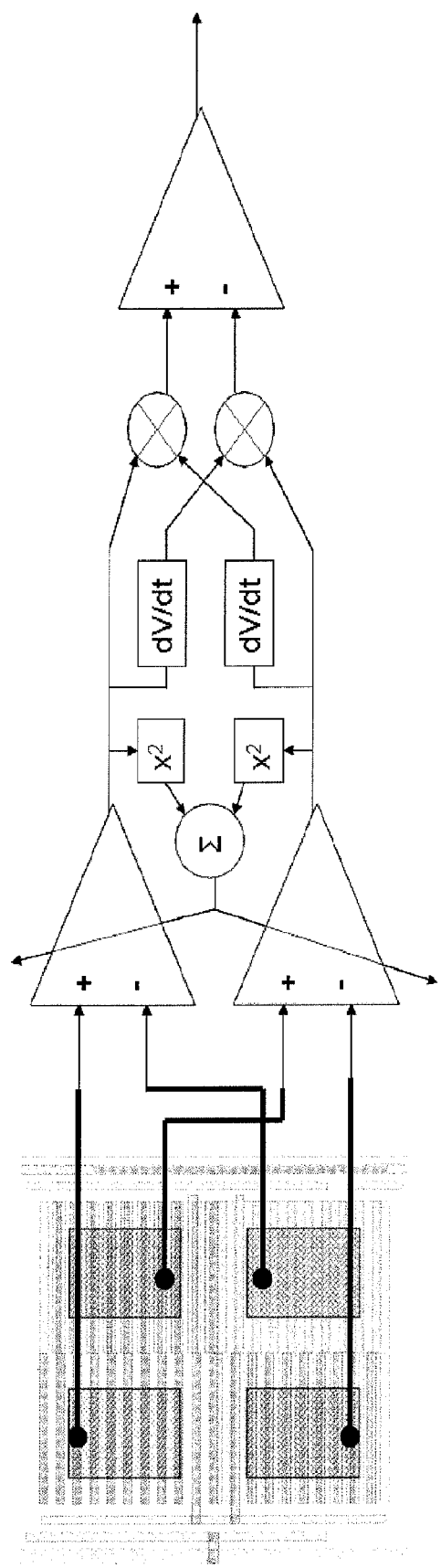
FIG. 15: Circuit schematic for directional motion sensor, taking complimentary outputs of ASPs, and correlating each against the other's time derivative, according to an illustrative aspect of the invention.

FIG. 15 schematically illustrates a directional motion sensor, taking complimentary outputs of ASPs and correlating each against the other's time derivative. The required computations may be performed in the digital domain, but may also be computed in the analog domain for very low power using translinear circuits. We have tested such a circuit using off-the shelf components and the ASPs shown in FIG. 3. The resulting outputs show an ability to distinguish directional motion such as a hand moving back and forth above the chip. Note that a single such motion-estimation circuit could easily be shared among multiple ASPs, as part of an addressable array of analysis blocks.

Such motion extraction has a variety of applications. One simple application is a vehicle velocity estimator, using small Fourier arrays embedded in pavement to estimate the speed and direction of vehicles passing overhead. Another is in motion characterization in wildlife tracking tags, where different types of motion could be used to characterize behavior.

A third is in video compression, as part of frame-prediction: rather than sending successive frames (or even differences between frames) if the velocity of optical flow is known, subsequent frames can be predicted with high precision, and only differences between this prediction and reality need to be captured to entirely encode subsequent frames. In more localized sensors, this same approach would work, but would instead provide a local estimate of directional motion.

Extracting Scene Statistics and Edges

For many useful visual tasks, much less information is needed than is provided by a complete Fourier transform or Gabor filter bank. For example, simple edge finding is extremely useful for many tasks, such as automatic object partitioning. In addition, humans presented with only the edges in a scene can still perform many useful tasks even though the image does not "look like" the original scene. Edges could be extracted by using an ASP array with lenses to generate Gabor-like filtering in a particular scale of ASP, and then take the outputs from different phases, square and sum them (extracting a measure of "edge power"), and only report this number. Indeed, in many cases it would be possible to set a threshold on edge power, and report edges in a 1-bit format, providing massive compression.

More generally, a lot of information can be extracted from a scene based on simple statistics. For example, in the case of a bird tag, analysis of scene statistics could provide significant information about habitat, roosting location and behavior with only a few numbers. For example, in either a lensless Fourier array or lens-based system, squaring and summing the (subtracted) outputs of complimentary ASPs provides a simple measure of scene complexity, reflecting aspects of the bird's surrounding (bushes vs. open sky). Going further, comparing the total power from ASPs of different orientations would provide useful distinctions between highly oriented surroundings such as marsh grass, and disorganized settings such as shrubs. These computations require only squaring circuits, summing circuits, and multiplication circuits, which can all be implemented by analog circuits using very little power and area.

Geolocation by "Shooting the Sun"

Recent work by at the Cornell Lab of Ornithology has demonstrated that by using an accurate clock and a simple light sensor to record the times of sunset and sunrise, active tracking tags can be used to localize migrating birds to within a few hundred kilometers (this is orders of magnitude lower power than, e.g., GPS). A significant improvement on this would be to actually "shoot the sun" the way pre-GPS navigators used to, using a Fourier array to find the sun's height in the sky. This would involve either comparing its angle to a known "down" (based on an accelerometer for example) or, more interestingly, by extracting both sun and horizon and computing their relative angle.

This problem can be broken into four steps: Step 1: compute likely sun angle plus intensity. This could be done using only a few vertical and horizontal ASPs; Step 2: Recompute outputs with expected signal from the sun accounted for and subtracted; Step 3: Compute location of horizon. This could be accelerated by looking at which orientations of ASP provide the strongest signal, and then computing the location and contrast of the horizon based on ASPs associated with that orientation; Step 4: compute residual signal once both sun and horizon are accounted for. If this is too great, the initial assumption that both sun and horizon are visible is invalid. Otherwise, the image has been reduced to six parameters that can be stored in memory or used immediately to compute the sun-horizon angle.

Support Circuits for Off-Chip Processing

It is impossible to predict all of the ways the outputs of an ASP array might be processed, implying that such arrays should support off-chip processing as well. However, these types of computations can be enhanced by dedicated local hardware. This could include the exemplary circuits described above, but also more general purpose components, such as simple circuits to subtract fed-back predictions based on identified features, local, short-term analog memory of previous frames (for computing derivatives, etc), and simple absolute-value and squaring circuits to permit computation of L1 and L2 norms (which are used for estimating residual error in iterative, general algorithms such as basis pursuit).

Because it is manufacturable in standard CMOS, the types of vision systems described herein are easily transferrable to industry and are manufacturable at very low cost in volume. By providing very low cost, compact, imaging systems, this technology has the capacity to generate significant economic impact. Example commercial applications would include low cost motion sensors, low cost reading of simple bar-codes, as well as imaging systems for low cost or low power video capture.

Exemplary Micro-Scale Camera Using Direct Fourier-Domain Scene Capture

A Planar Fourier Capture Array (PFCA) apparatus is designed to recover far-field information from an array of diverse ASPs. ASPs as described herein above, are composed of a photodiode under two metal gratings formed by interconnect metal layers intrinsic to modern planar semiconductor processes.

Individually, ASPs have a light sensitivity that varies sinusoidally with incident angle as in Equation 8

$$R = I_0(1 - m\cos(\beta\theta + \alpha))F(\theta)(1+\eta) \quad (8)$$

where R is the readout of the ASP, $I_0$ is proportional to the light flux at the ASP, $\theta$ is the incident angle along the sensitive axis, $\beta$ is the angular sensitivity (designed to range from 7 to 39 (see Equation 9), m is the modulation depth of the ASPs (see Equation 10), $\alpha$ is a designable phase offset, $F(\theta)$ is a slowly-varying aperture function, and $\eta$ is multiplicative noise.

Both the grating pitch p and the depth between the gratings d influence $\beta$, as follows:

$$\beta = 2\pi d/pn, \quad (9)$$

where n is the refractive index of the medium, in this case $SiO_2$. Modulation depth m is at a maximum when d is an integer multiple of half the Talbot depth:

$$m \text{ maximal when } d = a((p^2/\lambda) - (\lambda/4)). \quad (10)$$

Additionally, the angle-sensitive axis is set by the orientation of the metal gratings. This oriented, sinusoidal response is similar to the individual components of a 2D Fourier Transform, which is commonly used in image analysis.

Figure 16:
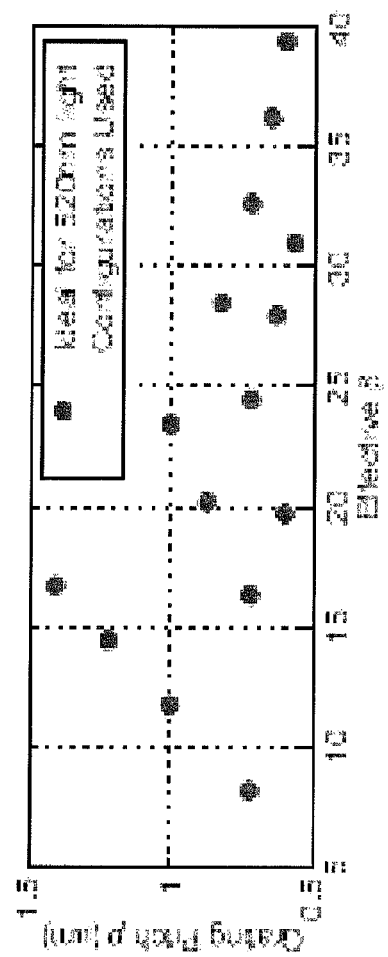
FIG. 16: Selecting Devices for the exemplary PFCA. Filled circles indicate manufacturable devices with ideal m for 520 nm light; open circles indicate the suite of devices we manufactured, according to an illustrative aspect of the invention.
Figure 17:
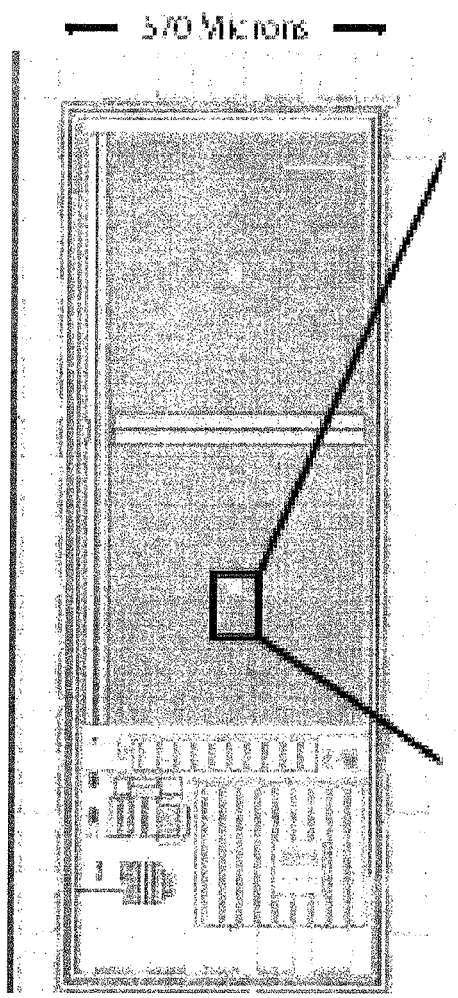
FIG. 17: Manufactured PFCA. Concentric rings of ASPs with increasingly high sinusoidal periodicity yield a complete Fourier description of the light intensity from the far field. Slowly varying orientation is evident from the enlarged section, where schematics show different metal layers in different colors, according to an illustrative aspect of the invention.

In general, the complete 2D Fourier transform of a far-field image can be computed by taking inner products of the image with oriented sinusoids of different periodicity. Therefore, an array of appropriately chosen ASPs can report Fourier-complete information about the far field. To accomplish Fourier completeness, we selected an ensemble of 18 combinations of p and d available in a 180 nm CMOS process (p is constrained by the minimum manufacturable linewidth of the metal, and d must correspond to one of four available inter-layer depths of the 5 metal layers suitable for making gratings) chosen to yield a collection of closely-spaced $\beta$s. Given minimum p constraints and a discrete number of manufacturable ds, there are a finite number of possible devices that satisfy Equation 10. Plotting $\beta$ and p of these devices for a design wavelength of 520 nm (in vacuum) light yields the filled circles of FIG. 16. To better span gaps in the spectrum of βs of ideal devices, our ensemble of devices includes designs optimal for different wavelengths, but all fairly close to optimal devices for 520 nm light (see open circles of FIG. 16). As illustrated in FIG. 17, we laid out 10μ×10μ devices in concentric rings around four central devices similar to those reported in C. Koch, J. Oehm, J. Emde, and W. Budde, Solid-State Circuits, IEEE Journal of 43, 1588 (2008), to capture low frequency information. Each design constitutes one ring of ASPs, with larger rings containing devices of higher β. The greater number of ASPs for higher-β devices permits more grating orientations. This is desirable since the number of independent Fourier components a given design must observe is proportional to β. Devices opposite each other have as (see Equation 8) 90° apart to capture magnitude and phase information of each Fourier component. We built two complementary arrays (with as differing by 180°; otherwise identical) of 38×38 unique ASPs (2888 sensors total) in an unmodified 180 nm CMOS process (FIG. 17).

Fourier completeness relies on our measurements tiling Fourier space up to our Nyquist limit. As the range of allowed incident angles increases, so does the frequency resolution needed to cover all Fourier space. Specifically, the relationship between the maximum allowable eccentricity of incident light (relative to the normal to the device) h and the maximum difference in β between consecutive designs is $$h = 180°(2)^{1/2} \Delta\beta. \quad (11)$$

With our $\Delta\beta$ of 2.62 (see FIG. 16), the ensemble transfer functions of either of the 1444-sensor arrays yield overcomplete coverage of Fourier space for images with h<48.6°.

Figure 18:
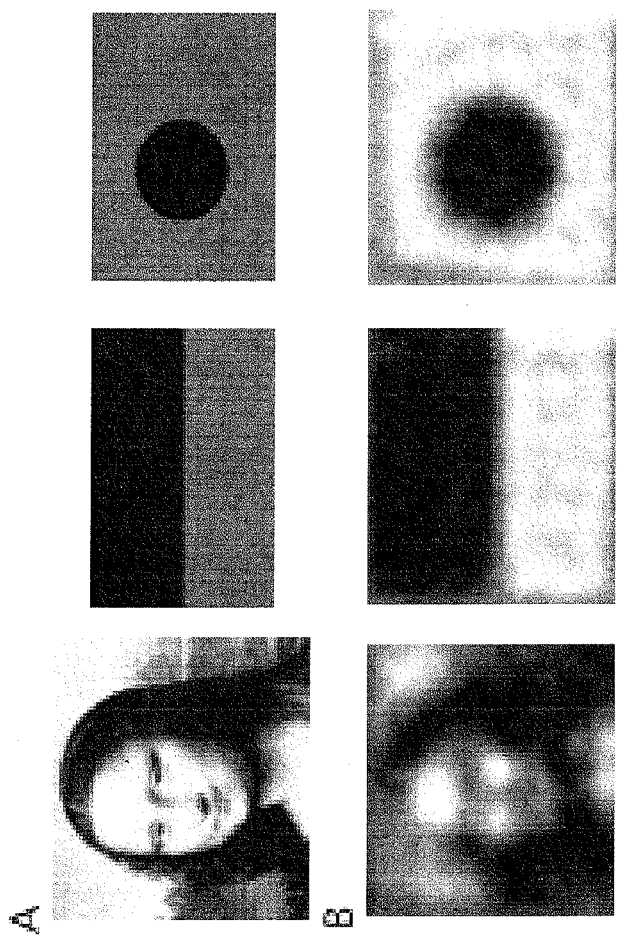
FIG. 18: Image Reconstructions: Using the basis functions obtained in a calibration phase, we reconstructed (B) the image presented (A) up to the Nyquist limit of our array using no off-chip optics.

As shown in FIG. 18A, we captured the ASP responses with an accumulation time of 16.7 ms, and successfully reconstructed the images in FIG. 18B up to the Nyquist limit of our sensor, set by the highest-β design in our array ($\beta_{max}$=39). Our effective resolution on the active square was approximately 20×20 pixels; the number of resolvable pixels scales with $\beta^2_{max}$.

We t demonstrated a Planar Fourier Capture Array: an ASP array that relates complete Fourier information (up to a maximum spatial frequency) about the far field without using focusing optics. The device was manufactured in an unmodified semiconductor process and requires no external optics or alignment. Its construction cost and resolution specifications fill the gap between the smallest miniaturized cameras and single photodiodes, making it a suitable choice for a large range of cost- and size-sensitive applications that cannot be served with focusing optical systems.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

We claim:

1. An image processing system, comprising:
   at least two, complementary, angle sensitive pixel (ASP) structures, having a spatial frequency domain ASP output including a background output and a plurality of ASP response outputs, in response to an optical input;
   an ASP response output subtractor component, which functions to suppress the background output and perform a subtraction of at least two of the ASP response outputs; and
   a processing component that can process the subtracted spatial frequency domain ASP response outputs.

2. The image processing system of claim 1, wherein at least some of the at least two ASP structures are diverse ASP structures that have at least one of a different periodicity, orientation, phase, and spatial scale.

3. The image processing system of claim 1, wherein the at least two ASP structures include a sufficient number of ASP structures to provide an invertible ASP signal output.

4. The image processing system of claim 1, wherein the ASP response output subtractor component is characterized by performing a subtraction of at least two ASP response outputs having complementary offsets.

5. The image processing system of claim 1, further comprising at least one lens element disposed axially on an input side of the at least two ASP structures.

6. The image processing system of claim 5, further comprising a plurality of lens elements and a respective plurality of diverse ASPs that have at least one of a different periodicity, orientation, phase, and spatial scale.

7. The image processing system of claim 6, wherein the plurality of lens elements are identical.

8. The image processing system of claim 5, wherein the at least one lens element is disposed at other than a focal distance in front of the ASP structure.

9. The image processing system of claim 1, wherein the at least two ASP structures have filter functions that match the basis functions of a two-dimensional Fourier transform, and the at least two ASP structures form a Fourier array such that they further form a complete or over-complete basis set in frequency-space up to a maximum spatial frequency.

10. The image processing system of claim 1, wherein the at least two ASP structures have filter functions that match the basis functions of a two-dimensional Hartley transform, and the at least two ASP structures form a Hartley array such that they further form a complete or over-complete basis set in frequency-space up to a maximum spatial frequency.

11. The image processing system of claim 9, comprising a plurality of Fourier arrays.

12. The image processing system of claim 1, wherein the image processing system is integrally disposed in a CMOS component.

13. The image processing system of claim 12, wherein the image processing system is a camera.

14. An optical domain image processing method, comprising:
providing at least two, complementary, angle sensitive pixel (ASP) structures;
obtaining a spatial frequency domain ASP output including a plurality of complementary ASP response outputs, in response to an optical input;
performing a wavelet-like transform of the ASP response outputs in the optical domain prior to performing any operation in a digital domain; and
obtaining a desired output of the optical input.

15. The image processing method of claim 14, wherein the step of performing a wavelet-like transform of the ASP response outputs in the optical domain further comprises performing a subtraction of at least two of the complementary ASP response outputs.

16. The image processing method of claim 14, wherein the step of obtaining a desired output of the optical input further comprises obtaining at least one of an optical image of the optical input, an object recognition of the optical input, a motion direction detection of the optical input, an edge detection of the optical input, an optical flow detection, a biometric detection, a text extraction, a texture detection.

17. The image processing method of claim 14, wherein the step of providing at least two, complementary ASP further comprises providing at least two diverse ASP structures that have at least one of a different periodicity, orientation, phase, and spatial scale.

18. The image processing method of claim 17, further comprising obtaining an invertible ASP signal output.

19. The image processing method of claim 14, further comprising disposing at least one lens element on a light input side of the at least two ASP structures and providing a defocused lens element output of an object light as the optical input to the at least two ASPs.

20. The image processing method of claim 19, further comprising disposing a plurality of lens elements on a light input side of a respective plurality of diverse ASPs that have at least one of a different periodicity, orientation, phase, and spatial scale.

21. The image processing method of claim 20, further comprising disposing a plurality of identical lens elements.

22. The image processing method of claim 14, further comprising providing at least two, complementary ASP structures having filter functions that match the basis functions of a two-dimensional Fourier transform, wherein the at least two ASP structures form a Fourier array such that they further form a complete or over-complete basis set in frequency-space up to a maximum spatial frequency.

23. The image processing method of claim 14, further comprising providing at least two, complementary ASP structures having filter functions that match the basis functions of a two-dimensional Hartley transform, and the at least two ASP structures form a Hartley array such that they further form a complete or over-complete basis set in frequency-space up to a maximum spatial frequency.

24. The image processing method of claim 14, further comprising providing at least two, complementary ASP structures integrally disposed in a CMOS component.

25. The image processing method of claim 14, further comprising performing a wavelet-like transform of the ASP response outputs in the optical domain prior to performing any operation in a digital domain, using no electrical or externally generated power.

* * * * *

UNITED STATES PATENT AND TRADEMARK OFFICE
CERTIFICATE OF CORRECTION

PATENT NO. : 8,767,047 B2
APPLICATION NO. : 13/813761
DATED : July 1, 2014
INVENTOR(S) : Alyosha Molnar, Albert Wang and Patrick Gill It is certified that error appears in the above-identified patent and that said Letters Patent is hereby corrected as shown below:

Insert the following after the Cross-Reference to Related Application paragraph:

--STATEMENT OF GOVERNMENT INTEREST

This invention was made with government funding under the National Institutes of Health grant EB009841. The United States Government has certain rights in this invention.--

Signed and Sealed this
Seventh Day of October, 2014

Michelle K. Lee
*Deputy Director of the United States Patent and Trademark Office*